United States Patent [19]
Gard et al.

[11] Patent Number: 4,902,981
[45] Date of Patent: Feb. 20, 1990

[54] WELL CASING POTENTIAL MEASUREMENT TOOL WITH COMPENSATED DC ERRORS

[75] Inventors: Michael F. Gard; William P. Goodwill, both of Plano, Tex.

[73] Assignee: Atlantic Richfield Company, Los Angeles, Calif.

[21] Appl. No.: 283,149

[22] Filed: Dec. 9, 1988

[51] Int. Cl.⁴ .............................................. H03F 3/38
[52] U.S. Cl. ........................................ 330/9; 324/715
[58] Field of Search .......................... 330/9, 256, 289; 324/64, 65 CR

[56] References Cited

U.S. PATENT DOCUMENTS

| | | | |
|---|---|---|---|
| 2,891,215 | 6/1959 | Fearon | 324/368 |
| 3,424,981 | 1/1969 | Erdman | 324/118 |
| 3,488,574 | 1/1970 | Tanguy | 324/368 |
| 4,048,574 | 9/1977 | Barbier et al. | 330/9 |
| 4,138,649 | 3/1979 | Schaffer | 330/9 |
| 4,178,544 | 12/1979 | Hoffman | 324/64 R |
| 4,264,860 | 4/1981 | Thebault | 324/118 |
| 4,392,112 | 7/1983 | Schade, Jr. | 330/9 X |
| 4,446,424 | 5/1984 | Chatanier | 324/65 P |
| 4,450,368 | 5/1984 | Spence | 330/9 X |
| 4,628,256 | 12/1986 | Powell | 324/118 |
| 4,641,105 | 2/1987 | Albaugh et al. | 330/9 |
| 4,686,477 | 8/1987 | Givens | 324/366 |

FOREIGN PATENT DOCUMENTS 3304814  8/1984  Fed. Rep. of Germany .......... 330/9

OTHER PUBLICATIONS

Ser. No. 889,572 filed 7/24/86 by Gard.

*Primary Examiner*—James B. Mullins
*Attorney, Agent, or Firm*—Jerry Mills

[57] ABSTRACT

A circuit for physical placement within an underground well to amplify low level differential DC voltage signals measured at a well casing is disclosed. The circuit incorporates an instrument amplifier with a first switching device before the amplifier and an inverter after the amplifier in the signal path. A second switching device selectively connects one of the amplifier and inverter outputs to a low-pass filter. The switching devices operate synchronously under control of an operating clock signal so that DC error terms associated with the amplifier are converted into a substantially AC error signal while maintaining the signal being amplified as a DC signal. The duty cycle of the operating clock signal is established to cause the substantially AC error signal to include a DC component of appropriate polarity and magnitude to compensate for DC error terms associated with the inverter and low-pass filter. The low-pass filter removes AC components, leaving an amplified DC output signal which is compensated for DC error terms of the circuit components. In addition, circuits for generating digital duration codes which define the operating clock signal duty cycle and which vary in accordance with environmental conditions are disclosed.

24 Claims, 2 Drawing Sheets

WELL CASING POTENTIAL MEASUREMENT TOOL WITH COMPENSATED DC ERRORS

TECHNICAL FIELD OF THE INVENTION

The present invention relates generally to logging devices which measure small DC voltage differences occurring in well casings. More specifically, the present invention relates to improved preamplifiers for use in such devices and to DC amplifier circuits in which amplifier offset voltage is minimized.

BACKGROUND OF THE INVENTION

Well casing corrosion is a common and often serious problem having considerable economic significance. Accordingly, much effort is given to the detection, mitigation, and prevention of corrosion. In most cases, is it desirable to determine not only the presence or absence of corrosion, but also to estimate the rate at which corrosion is occurring. In the particular case of galvanic corrosion, caused by naturally-occurring electrochemical cells involving well casing metal and formation fluids, it is widely known that the metal loss rate in a given interval is directly related to the amplitude of electrical current leaving the well casing in that interval.

In conventional well logging practice, a logging tool consisting of two electrodes spaced apart by a distance on the order of twenty feet is lowered into the well. These electrodes are generally connected directly to surface instruments by a logging cable. A differential voltage will appear across these two electrodes, with a magnitude and polarity indicative of the amplitude and direction, respectively, of electrical current flow in the casing. By plotting the casing potential as a function of depth, it is possible to obtain a casing potential profile which a skilled interpreter may use to identify intervals in which corrosion is suspected. However, the differential voltages so measured are very small and are strongly influenced by multiple sources of error, and thus the voltage log is, in generally, not definitive. Furthermore, the electrical resistance of the interval is generally not known, with the result that the current (and hence metal loss rate) can only be inferred from the log.

Because in situ casing resistance is an important measurement in its own right, some logging tools are designed to measure both voltage and resistance. From these two measurements, casing current is readily obtained by Ohm's law. Resistance is ordinarily measured by a four-wire technique, where a known current is injected into the casing while measuring the corresponding voltage difference at two points between the current injection points. It will be appreciated that the low resistance of well casing, on the order of several tens of microohms per linear foot, makes accurate measurement of casing resistance a difficult proposition because of the small voltages produced by any reasonable current level.

It is known that, given instruments with suitable sensitivity and stability, very accurate measurement of corrosion rates, location, and extent are possible. However, the differential DC voltage potentials to be measured in either of the two above-noted logs (casing potential and resistance) are in the microvolt range. Accurate measurement of such low-level DC voltages is a classic and persistent problem in electrical science. Consequently, noise immunity benefits result from amplifying such microvolt potentials at the logging tool within the well, then transmitting the amplified signal up to the earth's surface for measurement and recording.

The amplifying of microvolt potentials within a well requires the use of very precise, low noise, stable amplifying circuits. A first class of amplifying circuits potentially applicable to this environment is conventionally known as chopper stabilized amplifiers. However, chopper stabilized amplifiers modulate input signals to completely remove all DC components, amplify signals using AC amplifying techniques, then demodulate the amplified signals to retrieve the original DC component. Unfortunately, chopper-stabilized amplifiers tend to be noisy, and the processes of modulation and demodulation each contribute their own error components. Using non-ideal, or "real world" components, AC amplifying techniques tend to be less precise than DC amplifying techniques of equivalent complexity under controlled conditions. Consequently, accuracy and stability suffer.

An example of a second class of such amplifying circuits is described in U.S. patent application Ser. No. 889,572, filed on Jul. 24, 1986, by Michael F. Gard, and entitled "Well Casing Potential Measurement Tool," which is incorporated herein by reference. Gard's amplifying circuit routes a low level differential DC voltage through a first switching device to a differential amplifier. The output of the differential amplifier couples to a first input of a second switching device and through an inverter to a second input of the second switching device. An output of the second switching device couples to a low-pass filter, and the low-pass filter output serves as an output from the amplifying circuit. This amplifying circuit converts only the offset voltage errors from the differential amplifier into an alternating voltage through synchronized switching of the first and second switching devices, then filters the amplified signal to remove that AC offset error voltage. The Gard circuit improves upon conventional chopper stabilized amplifiers because the DC signal is maintained as a DC signal and is not modulated into an AC signal then demodulated back into a DC signal.

Gard's amplifying circuit removes a large portion of offset voltage error from the total sum of offset errors that can accumulate in the amplifier circuit. However, it does not remove all offset errors which are introduced by the inverter and the low-pass filter. Therefore, even with the use of very high quality and expensive components in the inverter and low-pass filter functions, some error can remain in the signal output from the Gard amplifier circuit.

SUMMARY OF THE INVENTION

Accordingly, it is an advantage that the present invention provides a well logging apparatus which uses an amplifying circuit that is stable, accurate and minimizes offset errors.

Another advantage is that the present invention provides an amplifying circuit wherein all signal paths are DC coupled and DC amplifying techniques are used for high signal reproduction accuracy.

Yet another advantage is that the present invention provides an amplifier circuit in which the duty cycle of a switching signal is adjusted to compensate for substantially all offset errors in the circuit.

Still another advantage is that the present invention provides a low noise, accurate amplifying circuit which can be implemented using moderate quality, inexpensive components and is extremely stable over a wide temperature range.

The above and other advantages of the present invention are carried out in one form by an amplifier circuit in which a first switching device receives a differential voltage input signal. This first switching device is configured so that the signal output therefrom exhibits a variable polarity. An input of a differential amplifier couples to the output of the first switching device. An output of the differential amplifier couples to a first input of a second switching device and to an input of an inverter. An output of the inverter couples to a second input of the second switching device. An output of the second switching device couples to an input of a filter. A clock circuit couples to control inputs of the first and second switching devices to synchronize the polarity of the signal output from the first switching device with the switching of the second switching device. The clock circuit is configured to compensate for offset errors in the amplifier, inverter, and filter.

BRIEF DESCRIPTION OF THE DRAWINGS

A more complete understanding of the present invention may be derived by referring to the detailed description and claims when considered in connection with the FIGURES, wherein like reference numbers refer to similar items throughout the FIGURES, and:

FIGS. 3A–3C show block diagrams of first, second, and third embodiments, respectively, of a duration code generator portion of the present invention.

DETAILED DESCRIPTION OF THE PREFERRED EMBODIMENTS

Figure 1:
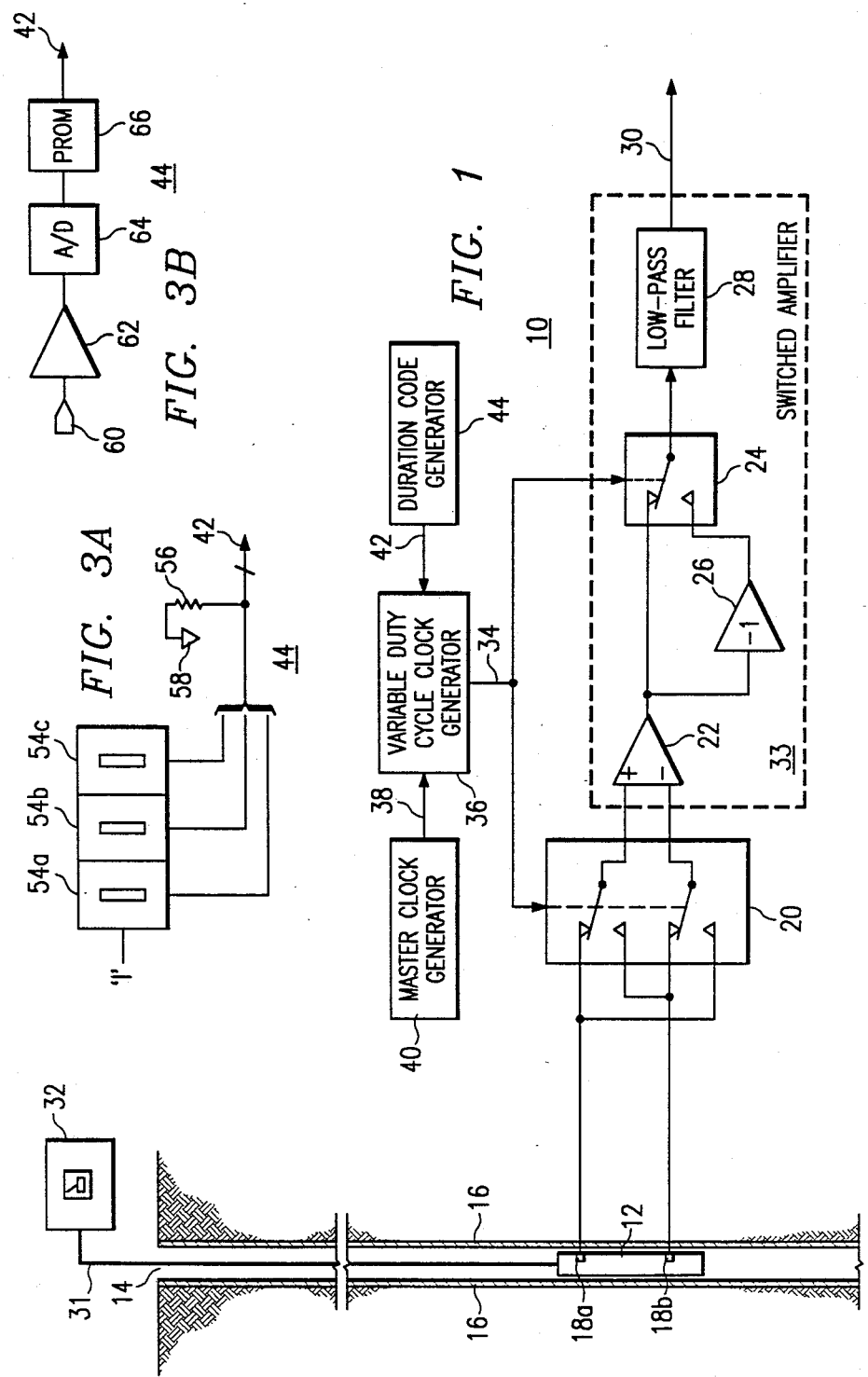
FIG. 1 shows a block diagram of the present invention.

FIG. 1 shows a DC amplifier 10 which is constructed in accordance with the teaching of the present invention. Amplifier 10 forms a part of a well logging device 12 which is intended for operation within a well 14 beneath the surface of the earth. Operation beneath the surface of the earth presents a severe environment in which to operate electronic circuitry, and electronic components utilized in amplifier 10 must perform over an extremely wide temperature range.

In the present invention, amplifier 10 measures a differential voltage which occurs between two points on a well casing 16. Such measurements are desirable in measuring casing resistance, and may be performed in conjunction with injecting DC currents into well casing 16. Consequently, well logging device 12 includes electrodes 18a and 18b which slidably contact well casing 16. Electrode 18a DC couples to first and fourth inputs of a MOS, JFET or bipolar switching device 20. Likewise, electrode 18b DC couples to second and third inputs of switching device 20.

The first and second outputs of switching device 20 DC couple to non-inverting and inverting, respectively, inputs of an instrumentation, or differential, amplifier 22. An output of amplifier 22 DC couples to a first input of a MOS or other suitable switching device 24 and to an input of an analog inverter 26. An output of analog inverter 26 DC couples to a second input of switching device 24. An output of switching device 24 DC couples to an input of a low-pass filter 28, and an output 30 of low-pass filter 28 provides an amplified DC signal which serves as the output from amplifier 10. Low-pass filter 28 in the preferred embodiment of the present invention is an active filter which has a cutoff frequency of around 10 Hertz and implements two poles in a Butterworth design. Output 30 serves as the output from logging device 12. The output from logging device 12 couples through a cable 31 to a measuring and recording apparatus 32 at the earth's surface. Alternatively, the output from logging device 12 may go to suitable amplification and other electronics in the downhole tool. Amplifier 22, switching device 24, inverter 26, and filter 28 together form a portion of the present invention referred to as a switched amplifier 33 below.

In the preferred embodiment of the present invention, each of switches 20 and 24, amplifier 22, inverter 26, and low-pass filter 28 are DC coupled to one another. The term "DC coupled" is well known in the electronics field and is used here in its conventional sense. For example, it is well known that a direct-coupled, or DC, amplifier has a zero frequency lower limit to its frequency range. That is, if a DC voltage is applied to the input of a DC coupled device or circuit, the output voltage will stabilize at a DC level and not drift back to a bias level. Amplifier 10 is DC coupled from electrodes 18a and 18b to output 30. Regardless of whether switching devices 20 and 24 operate, output 30 supplies a signal which is an amplified representation of the input signal sensed at electrodes 18a and 18b. However, the operation of switching devices 20 and 24 substantially removes errors inherent in the operation of amplifier 22, inverter 26, and filter 28 from the signal supplied at output 30.

In this embodiment, switching device 20 is a dual, two-to-one analog multiplexer in which the first and second inputs are selectively connected to a first output thereof, and the third and fourth inputs are selectively connected to a second output thereof. Similarly, switching device 24 is single, two-to-one analog multiplexer in which the first and second inputs are selectively coupled to the output thereof. Each of switching devices 20 and 24 has a control input which couples to an output 34 of a variable duty cycle clock generator 36. Clock generator 36 receives an input signal at a node 38 from a master clock generator 40, and receives a second input signal at a terminal 42 from a duration code generator 44. Duration code generator 44 supplies a digital code that defines the duty cycle of the operating clock signal.

Clock generator 36 produces an operating clock signal at output 34 which alternately exhibits high and low states. In a first one of these states, switching device 20 connects its first input to its first output and its third input to its second output. Moreover, in this first state switching device 24 connects its first input to its output. FIG. 1 illustrates the connections provided by switching devices 20 and 24 during this first state. When the operating clock signal exhibits a second one of these states, switching device 20 connects its second input to its first output and its fourth input to its second output while switching device 24 connects the second input to its output. Thus, the connections provided by switching devices 20 and 24 during this second state are opposite to the connections illustrated in FIG. 1.

The input connections of switching device 20 cause the differntial DC voltage detected at electrodes 18a and 18b to be supplied from the first and second outputs of switching device 20 at a polarity which varies in accordance with the state of the operating clock signal. This polarity alternates at the frequency of the operating clock signal. Moreover, switching device 20 is operated synchronously with the switching of switching device 24. When switching devices 20 and 24 exhibit the first state (discussed above), inverter 26 has substantially no influence on amplifier 10, and the DC voltage at output 30 may be described as follows:

$$V_{30} = GV_{18} + V_{os22} + V_{os28} \qquad \text{Eq. 1}$$

where $V_{30}$ equals the voltage at output 30, G is the gain of amplifier 22, $V_{18}$ represents the differential input voltage detected across electrodes 18a and 18b, $V_{os22}$ represents the offset error voltage of amplifier 22, and $V_{os28}$ represents the offset error voltage of filter 28.

As discussed above, in a typical application for amplifier 10 the differential voltage detected at electrodes 18a and 18b may be around one microvolt or less. Consequently, $V_{os22}$ may be 80 to 100 times greater than the signal being measured, and during the first state described by Equation 1, $V_{os22}$ provides a major influence on output $V_{30}$. Moreover, in a typical application G may advantageously be around 1000. Consequently, $V_{os28}$ typically has a smaller influence on $V_{30}$ than the influence contributed by $V_{os22}$.

When the state of the operating clock signal output from clock generator 36 changes to the second state (discussed above), switching devices 20 and 24 switch causing $V_{30}$ to change. Relative to the first state, the differential DC voltage supplied to the inputs of amplifier 22 exhibits an inverted polarity during the second state due to the operation of switching device 20. However, during the second state the amplified signal output from amplifier 22 is also inverted through the operation of inverter 26. Consequently, a differential DC signal being amplified by amplifier 10 exhibits the same polarity at output 30 during the second state as it did during the first state. However, during the second state the offset error voltage component $V_{os22}$ of the output signal $V_{30}$ now exhibits an opposing polarity due to the operation of inverter 26. Specifically, during the second state output $V_{30}$ may be described as follows:

$$V_{30} = GV_{18} - V_{os22} + V_{os26} + V_{os28} \qquad \text{Eq. 2}$$

where $V_{os26}$ represents the offset error voltage of inverter 26. As can be seen by examining Equations 1 and 2, the G, $V_{18}$, and $V_{os28}$ terms exert the same influence over $V_{30}$ during both states, the polarity of the $V_{os22}$ term reverses, and during the second state a $V_{os26}$ term exerts an influence upon $V_{30}$ which was not exerted during the first state. Like the $V_{os28}$ term discussed above, $V_{os26}$ exerts a relatively small influence on $V_{30}$ when compared to the influence exerted by $V_{os22}$ due to the large gain G of differential amplifier 22.

When the operating clock signal output from variable duty cycle clock generator 36 exhibits a 50% duty cycle, amplifier 10 spends 50% of the time in the first state and 50% of the time in the second state. Thus, the filtered output $V_{30}$ from low-pass filter 28 equals the average of Equations 1 and 2. This average may be described as follows:

$$V_{30} = GV_{18} + \tfrac{1}{2}V_{os26} + V_{os28} \qquad \text{Eq. 3}$$

As shown by Equation 3, the influence of $V_{os22}$ has been entirely removed from $V_{30}$ when the operating clock signal duty cycle is 50%. However, influences due to DC error terms associated with inverter 26 and low-pass filter 28 remain. Consequently, in the present invention the duty cycle of the operating clock signal output from clock generator 36 varies so that the operating clock signal typically does not precisely exhibit a 50% duty cycle. A small amount of the $V_{os22}$ error term remains in the output signal $V_{30}$ at a polarity and magnitude which is selected to cancel out the $V_{os26}$ and $V_{os28}$ terms. As a result of such duty cycle manipulation, the output of amplifier 10 may be described as follows:

$$V_{30} = GV_{18} \qquad \text{Eq. 4}$$

As shown in Equation 4, DC error voltage terms from amplifier 22, inverter 26, and low-pass filter 28 have been compensated and no longer influence the output signal $V_{30}$ from amplifier 10. Although not specifically discussed above, those skilled in the art will recognize that the Equation 4 result additionally compensates for secondary DC error sources, such as charge transfer transients from switches 20 and 24.

Figure 2:
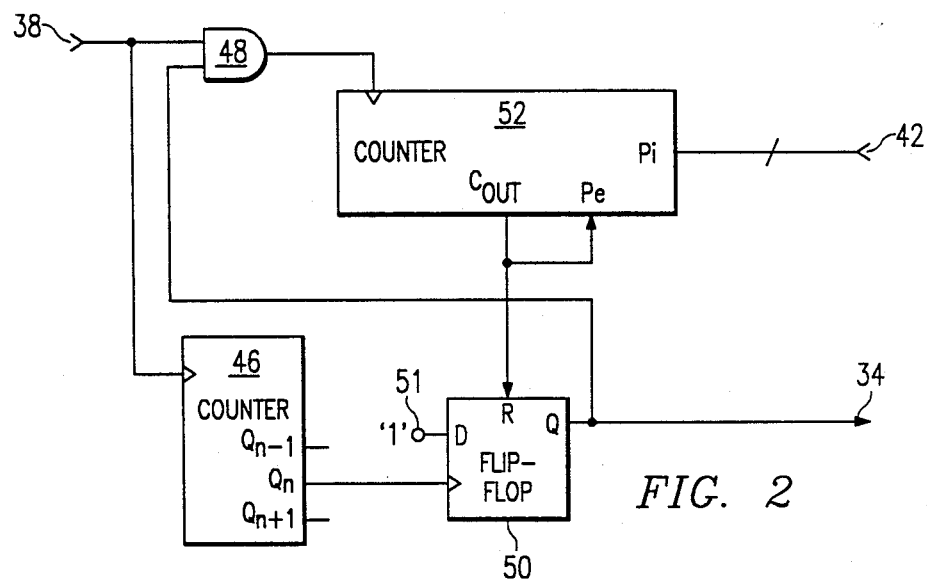
FIG. 2 shows a block diagram of a variable duty cycle portion of the present invention.

FIG. 2 shows a block diagram of one implementation of variable duty cycle clock generator 36. In FIG. 2, node 38, which receives the master clock signal, couples to a clock input of a counter 46 and to a first input of a logical AND element 48. Counter 46 may be implemented using one or more conventional digital counters. A $Q_n$ output of counter 46 couples to a clock input of a D flip-flop 50. A Q output of flip-flop 50 couples to a second input of logical AND element 48 and serves as output 34 from variable duty cycle clock generator 36. A D input of flip-flop 50 couples to a terminal 51 which provides a static logical one value. An output of logical AND element 48 couples to a clock input of a counter 52. Counter 52 may be implemented using one or more conventional presettable counters. A carry output of counter 52 couples to a parallel enable input of counter 52 and to a reset input of flip-flop 50. Terminal 42 from duration code generator 44 (see FIG. 1) couples to a parallel input of counter 52 and provides a digital code of one or more bits for loading into counter 52.

Master clock generator 40 (see FIG. 1) produces a master clock signal which exhibits a series of master clock cycles at a frequency which is greater than the frequency of the operating clock signal produced at output 34 of clock generator 36. Counter 46 is configured as a free-running counter which counts the master clock cycles. The output $Q_n$ from counter 46 establishes the operating frequency of the operating clock signal.

The output $Q_n$ from counter 46 generates a free-running clock signal having a 50% duty cycle and a frequency which is $\tfrac{1}{2}^n$ times the frequency of the master clock signal. Once during each cycle of the free-running clock signal output from counter 46, this clock signal clocks flip-flop 50 causing the Q output of flip-flop 50 and the operating clock signal presented at output 34 to exhibit a logical one. As soon as output Q from flip-flop 50 exhibits a logical one, logical AND element 48 becomes enabled, and counter 52 begins to count master clock cycles. Counter 52 begins counting from an intial state which was established by a duration code previously loaded into counter 52 from terminal 42. Counter 52 continues to count master clock cycles until a terminal count occurs, which causes the carry output from counter 52 to become active. The activation of this carry output resets flip-flop 50 so that the operating clock signal at output 34 changes to a logical zero state.

Consequently, counter 52 establishes the duration of the logical one state for each cycle of the operating clock signal. In addition, the activation of the carry output from counter 52 enables the parallel enable input of counter 52, and causes the duration code presented at terminal 42 to be loaded into counter 52 so that counter 52 will be programmed for the next operating clock signal cycle. The loading of the duration code into counter 52 deactivates the carry output and removes the reset signal from flip-flop 50. The resetting of flip-flop 50 disables logical AND element 48 so that counter 52 no longer counts master clock cycles until the Q output of flip-flop 50 again changes to a logical one state. Thus, the operating clock signal remains in the logical zero state until the $Q_n$ output of counter 46 again causes flip-flop 50 to change states.

In the preferred embodiment of the present invention, the variable "n" used in connection with counter 46 is equal to 10. Thus, the operating clock signal frequency is 1/1024 of the master clock signal frequency, and the duty cycle established by counter 52 can be adjusted in approximately 0.1% increments. Those skilled in the art will recognize that alternate outputs from counter 46, such as $Q_{n-1}$ or $Q_{n+1}$, can be used to change the granularity of duty cycle adjustment counted by counter 52. For example, if the $Q_{n-1}$ output of counter 46 were coupled to the clock input of flip-flop 50, rather than the $Q_n$ output as shown in FIG. 2, and n equals 10 as discussed above, then the master clock signal would exhibit a frequency 512 times greater than the operating clock signal, and counter 52 could adjust the duty cycle of the operating clock signal in steps of approximately 0.2%.

Figure 3C:
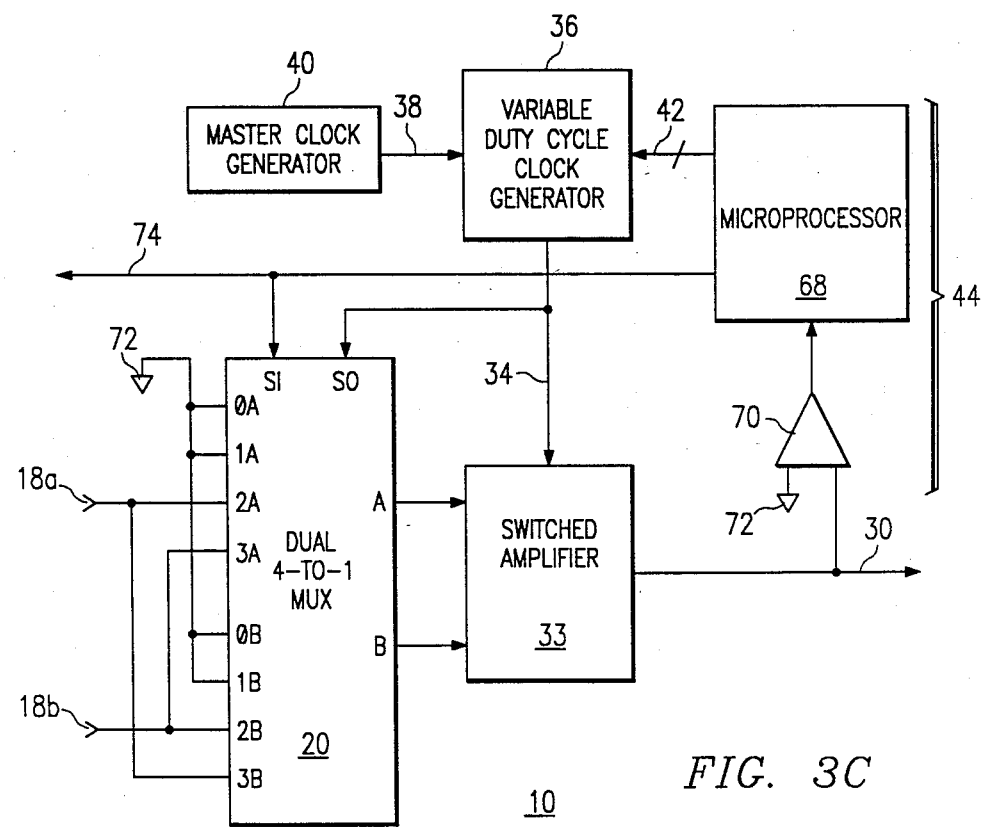

Although variable duty cycle clock generator 36 generates the operating clock signal, the duration code provided at terminal 42 by duration code generator 44 defines and controls the operating clock signal duty cycle. FIGS. 3A, 3B, and 3C show block diagrams of first, second, and third embodiments, respectively, of duration code generator 44. With reference to FIG. 3A, the first embodiment of duration code generator 44 is provided in a series of manual thumbwheel switches 54a, 54b, and 54c. Each of switches 54a–54c may advantageously be a decade switch which provides a 4 bit BCD output. An input to switches 54a–54c is connected to a terminal that supplies a first predetermined voltage level, such as a logical 1, and outputs of switches 54a–54c couple through individual resistors, collectively shown as resistance 56, to a ground terminal 58, which supplies a second predetermined voltage level.

In order to establish a duration code value in this first embodiment of duration code generator 44, an operator of logging device 12 (see FIG. 1) may monitor output 30 of amplifier 10 (see FIG. 1) using apparatus 32 or a conventional voltage measurement device. Then, electrodes 18a and 18b may be shorted together so that a zero volt differential signal is supplied for $V_{18}$ discussed above in connection with Equations 1 through 4. In this situation, the output voltage $V_{30}$ is influenced only by the DC error terms $V_{os22}$, $V_{os26}$, and $V_{os28}$ (see Equations 1 and 2 above). Thus, the operator may adjust switches 54a–54c until $V_{30}$ equals zero volts or is otherwise within an accepted tolerance. At this point, the duty cycle exhibited by the operating clock signal has been adjusted so that the DC error terms generated by amplifier 22, inverter 26, and low-pass filter 28 have been compensated. The short may be then removed from the inputs to amplifier 10, and amplifier 10 operated.

Although the first embodiment of duration code generator 44 works acceptably well for many applications, it does not provide a dynamic duration code which automatically changes as DC error voltage terms drift. One particularly pervasive cause of drift in DC error voltage terms is a corresponding temperature change. Moreover, logging device 12 (see FIG. 1) is anticipated to operate in a harsh environment which can experience a wide variation in temperature. Consequently, the second embodiment of duration code generator 44, shown in FIG. 3B, provides a duration code at terminal 42 which varies in response to temperature.

In accordance with the second embodiment of duration code generator 44, a temperature sensor 60 provides an analog temperature value which corresponds to the temperature being sensed by temperature sensor 60. Temperature sensor 60 has an output which couples to an input of an amplifying and signal conditioning circuit 62. An output of amplifying and signal conditioning circuit 62 supplies an analog temperature value and couples to an input of an analog-to-digital converter 64. An output of analog-to-digital converter 64 supplies a digital temperature value and couples to address inputs of a PROM 66. An output of PROM 66, which may consist of one or more bits, serves as terminal 42.

PROM 66 stores a table of duration code values which are needed to define duty cycles to compensate amplifier 10 in varying temperature conditions. This table of duration code values may be determined empirically and then programmed into PROM 66 prior to operating logging device 12 within well 14 (see FIG. 1). The temperature at which amplifier 10 operates is sensed by temperature sensor 60 and converted into analog and digital temperature values in circuits 62 and 64 so that the temperature value indexes the table of duration code values programmed into PROM 66. Consequently, the duration code output by PROM 66 varies in response to temperature.

FIG. 3C shows the third embodiment of duration code generator 44. This third embodiment requires neither manual adjustments nor empirical observations. As shown in FIG. 3C, duration code generator 44 essentially represents a microprocessor 68 and an analog comparator 70. Master clock generator 40, variable duty cycle clock generator 36, and switched amplifier 33 may be the same components as discussed above. However, switching device 20 in this third embodiment is now a dual, four-to-one analog multiplexer rather than the dual, two-to-one analog multiplexer discussed above in connection with FIG. 1. Thus, OA, 1A, OB, and 1B inputs of switching device 20 each couple together and to a terminal 72, which is adapted to receive a common potential, such as ground. Inputs 2A, 3A, 2B, and 3B of switch 20 DC couple to electrodes 18a and 18b as discussed above in connection with inputs 1 through 4 of the dual, two-to-one analog multiplexer 20 of FIG. 1.

Output 30 from switched amplifier 33 couples to a first input of comparator 70, and a second input of comparator 70 couples to ground terminal 72. An output of comparator 70 couples to an input port of microprocessor 68. A first output port of microprocessor 68 provides terminal 42, which is a one or more bit input to variable duty cycle clock generator 36 as discussed above. A second output, which is a single bit data output port of microprocessor 68, couples to a most significant selection input of switching device 20 and serves as a signalling output 74 from amplifier 10. Output 34 from variable duty cycle clock generator 36 couples to a least significant selection input of switching device 20 and to switched amplifier 33.

In this third embodiment, microprocessor 68 may be of the single chip variety which incorporates both program and temporary memory within microprocessor 68. This program memory is configured so that amplifier 10 performs a calibration procedure when amplifier 10 is powered-up, and at regular intervals thereafter. Such regular intervals may, for example, be around from two to five minutes. During this calibration procedure, microprocessor 68 controls output 74 so that switching device 20 selects the 0 and 1 inputs of switching device 20 for connection to the outputs thereof. External circuitry, such as apparatus 32 (see FIG. 1) may monitor output 74 as an indication of the validity of output 30. Output 30 is not valid when switching device 20 selects the 0 and 1 inputs, which connect a predetermined input voltage of around zero volts to the input of switched amplifier 33.

As discussed above in connection with FIG. 3A, a zero volt input causes output 30 of switched amplifier 33 to be at zero volts plus an accumulation of DC error terms. In other words, output 30 exhibits zero volts after all DC error terms have been compensated. Comparator 70 compares output 30 with a zero volt input and supplies a digital comparison result to an input of microprocessor 68. Microprocessor 68 monitors this comparison result and increments or decrements the duration code supplied to clock generator 36 in response to the comparison result. The rate at which the duration code may be incremented or decremented is determined largely by the cutoff frequency of low-pass filter 28 (see FIG. 1) within switched amplifier 33. Microprocessor 68 continues to increment or decrement the duration code until the comparison result output from comparator 70 begins to change states. This condition occurs when output 30 exhibits a value approximately equal to zero volts. Thus, when the comparison result output from comparator 70 begins to change states, the duration code value output from microprocessor 68 defines a duty cycle for the operating clock signal which substantially compensates DC error terms in amplifier 10.

In summary, the present invention provides a well logging apparatus which minimizes offset errors. In addition, the present invention need not utilize high quality parts because the larger DC voltage error terms present in moderate quality parts may be sufficiently compensated by appropriate adjustment of the operating clock signal duty cycle. In addition, the embodiments of duration code generator 44 shown in FIGS. 3B and 3C cause the duration code values to change in accordance with time or temperature so that amplifier 10 remains stable and compensated as environmental conditions change. Moreover, amplifier 10 employs DC coupling throughout so that a highly accurate output signal results.

The present invention has been described above with reference to preferred embodiments. However, those skilled in the art will recognize that changes and modifications may be made in these preferred embodiments without departing from the scope of the present invention. For example, those skilled in the art will recognize that the signal polarities and specific logical elements discussed in connection with the present invention may be implemented in a wide variety of structures. In addition, those skilled in the art will recognize that the variable duty cycle clock generator 36 may advantageously be formed within microprocessor 68 of FIG. 3C so that counters 46 and 52 (see FIG. 2) are implemented in registers or temporary memory locations. These and other changes and modifications which are obvious to those skilled in the art are intended to be included within the scope of the present invention.

What is claimed is:

1. An amplifier for a differential voltage signal comprising:
   means for alternating polarity of said differential voltage signal to produce a switched low level signal;
   an amplifier having an input coupled to said alternating polarity means and an output which supplies an amplified signal;
   an inverter having an input coupled to said amplifier output and having an output which supplies an inverted signal;
   means, coupled to said amplifier and said inverter, for alternatiely filtering said amplified signal and said inverted signal to produce a filtered output signal; and
   means, coupled to said alternating polarity means and to said alternately filtering means, for synchronizing polarity of said differential voltage with filtering of said amplified and inverted signal to compensate for offset errors in said amplifier, inverter, and alternately filtering means.

2. An amplifier as claimed in claim 1 wherein said synchronizing means comprises a clock generator which produces an operating clock signal having a variable duty cycle.

3. An amplifier as claimed in claim 2 wherein said operating clock signal exhibits a series of operating cycles at an operating frequency, and said clock generator comprises:
   means for producing a master clock signal which exhibits a series of master cycles at a frequency greater than said operating frequency;
   a first counter coupled to said master clock signal producing means, said first counter being configured to count said master cycles of said master clock signal to establish said operating frequency; and
   a second counter coupled to said master clock signal producing means, said second counter being configured to count said master cycles of said master clock signal to establish a duration over which said operating clock signal exhibits a first logical state in said operating cycles.

4. An amplifier as claimed in claim 3 wherein said clock generator additionally comprises means, coupled to said second counter, for supplying a duration code which defines said duration over which said operating clock signal exhibits said first logical state.

5. An amplifier as claimed in claim 4 wherein said duration code supplying means comprises:
   a temperature sensor having an output which supplies a temperature value; and
   means for indexing a table of duration code values, using said temperature value as an index, to cause said duration code to vary in response to temperature.

6. An amplifier as claimed in claim 4 wherein said duration code supplying means comprises:

means, coupled to said altering polarity means, for forcing said differential voltage to exhibit a first predetermined voltage;

means, coupled to said alternately filtering means, for comparing said filtered output signal with a second predetermined voltage to produce a comparison result; and means, coupled to said comparing means, for adjusting said duration code in response to said comparison result.

7. An amplifier as claimed in claim 6 wherein:

said forcing means is configured so that said first predetermined voltage is approximately zero volts; and said comparing means is configured so that said second predetermined voltage is approximately zero volts.

8. An amplifier as claimed in claim 4 wherein said duration code supplying means comprises a switch coupled to said second counter.

9. A well logging apparatus for measuring DC voltage differences occurring between first and second points on a well casing, said apparatus comprising:

means for detecting DC voltages at said first and second points on said well casing;

first connecting means, having first and second inputs coupled to said detecting means to receive said DC voltages, having a control input, and having first and second outputs, for selectively supplying said DC voltages at said first and second connecting means outputs at a variable polarity;

a differential amplifier having first and second inputs DC coupled to said first connecting means first and second outputs, respectively, and having an output which produces a first signal;

an inverter having an input DC coupled to said differential amplifier output and having an output which produces a second signal;

second connecting means, having a first input DC coupled to said differential amplifier output, a second input DC coupled to said inverter output, a control input, and an output, for selectively supplying one of said first signal and said second signal at said second connecting means output;

a filter having an input DC coupled to said second connecting means output and having an output for supplying an amplified DC voltage signal; and clock means, having an output coupled to said first and second connecting means control inputs, for causing said first connecting means to alternate said variable polarity of said DC voltages at said outputs of said first connecting means in synchronization with alternate supply of said first and second signals at the output of said second connecting means, said clock means generating a clock signal having a duty cycle established to compensate for errors in said inverter and said filter.

10. A well logging apparatus as claimed in claim 9 wherein said clock signal represents a series of cycles at a clock frequency, and said clock means comprises:

a clock signal generator for supplying a master clock signal which exhibits a frequency greater than said clock frequency of said clock signal;

a first counter, coupled to said clock signal generator, for establishing said clock frequency of said clock signal; and a second counter, coupled to said clock signal generator, for establishing a duration over which said clock signal exhibits a first logical state in said cycles of said clock signal.

11. A well logging apparatus as claimed in claim 10 wherein said clock means additionally comprises programming means, coupled to said second counter, for generating a duration code which defines said duration over which said clock signal exhibits said first logical state.

12. A well logging apparatus as claimed in claim 11 wherein said programming means comprises:

a temperature sensor having an output; and a memory circuit having an input coupled to said temperature sensor output and having an output coupled to said second counter, said memory circuit being configured so that said duration code varies in response to temperature detected by said temperature sensor.

13. A well logging apparatus as claimed in claim 11 wherein said programming means comprises:

means, coupled to said first connecting means, for forcing said differential amplifier to receive a signal having a first predetermined voltage magnitude;

means, coupled to said filter output, for comparing said amplified DC voltage signal with a second predetermined voltage; and means, coupled to said comparing means and to said second counter, for adjusting said duration code in response to an output signal from said comparing means.

14. A well logging apparatus as claimed in claim 13 wherein said forcing means and said comparing means are configured so that said first and second predetermined voltages are both approximately zero volts.

15. An amplifier for low level DC signals comprising:

first switching means, having a control input and first and second outputs, for supplying a differential DC voltage at said first switching means outputs so that said differential DC voltage has a variable polarity;

a differential amplifier having first and second inputs DC coupled to said first switching means first and second outputs, respectively, and having an output;

an inverter having an input DC coupled to said differential amplifier output and having an output;

second switching means, having a first input DC coupled to said differential amplifier output, a second input DC coupled to said inverter output, a control input, and an output, for selectively connecting one of said differential amplifier output and said inverter output to said second switching means output;

a filter having an input DC coupled to said second switching means output and having an output for supplying an amplified DC signal; and clock means, having an output coupled to said first and second switching means control inputs, for causing said first switching means to alternate the polarity of said differential DC voltage in synchronization with alternate connection of said differential amplifier and inverter outputs to said second switching means output, said clock means generating a clock signal having a duty cycle established to compensate for errors in said inverter and said filter.

16. An amplifier as claimed in claim 15 wherein said clock signal represents a series of cycles at a clock frequency, and said clock means comprises:

a clock signal generator for supplying a master clock signal which exhibits a frequency greater than said clock frequency of said clock signal;

a first counter, coupled to said clock signal generator, for establishing said clock frequency of said clock signal;

a second counter, coupled to said clock signal generator, for establishing a duration over which said clock signal exhibits a first logical state in said cycles of said clock signal; and programming means, coupled to said second counter, for generating a duration code which defines said duration over which said clock signal exhibits said first logical state.

17. An amplifier as claimed in claim 16 wherein said programming means comprises:

means, coupled to said first switching means, for forcing said differential amplifier inputs to receive a signal exhibiting approximately zero volts;

means, coupled to said filter output, for comparing said amplified DC signal with a voltage of approximately zero volts; and means, coupled to said comparing means and said second counter, for adjusting said duration code in response to an output signal from said comparing means.

18. A method for amplifying a differential DC voltage comprising the steps of:

alternating polarity of said differential DC voltage to produce a switched low level DC signal;

amplifying said switched low level DC signal to produce an amplified DC signal;

inverting said amplified DC signal to produce an inverted DC signal;

alternately filtering said amplified DC signal and said inverted DC signal to produce a filtered output signal;

synchronizing said alternating polarity and alternately filtering steps; and dynamically controlling said synchronizing step to compensate for offset errors in said amplifying, inverting, and alternately filtering steps.

19. A method as claimed in claim 18 wherein said synchronizing step comprises the step of generating an operating clock signal having a variable duty cycle.

20. A method as claimed in claim 19 wherein said operating clock signal exhibits a series of operating cycles at an operating frequency, and said generating step comprises the steps of:

producing a master clock signal which exhibits a series of master cycles at a frequency greater than said operating frequency;

counting said master cycles of said master clock signal to establish said operating frequency; and counting said master cycles of said master clock signal to establish a duration over which said operating clock signal exhibits a first logical state in said operating cycles.

21. A method as claimed in claim 20 wherein said generating step additionally comprises the step of supplying a duration code which defines said duration over which said operating clock signal exhibits said first logical state.

22. A method as claimed in claim 21 wherein said supplying step comprises the steps of:

sensing temperature to obtain a temperature value; and indexing a table of duration code values, using said temperature value as an index, to cause said duration code to vary in response to temperature.

23. A method as claimed in claim 1, wherein said supplying step comprises the steps of:

forcing said differential DC voltage to exhibit a first predetermined voltage;

comparing said filtered output signal with a second predetermined voltage to produce a comparison result; and adjusting said duration code in response to said comparison result.

24. A method as claimed in claim 23 wherein:

said forcing step comprises the step of establishing said first predetermined voltage at approximately zero volts; and said comparing step comprises the step of setting said second predetermined voltage at approximately zero volts.

* * * * *